United States Patent [19]

Rehme et al.

[11] Patent Number: 4,646,253

[45] Date of Patent: Feb. 24, 1987

[54] METHOD FOR IMAGING ELECTRICAL BARRIER LAYERS SUCH AS PN-JUNCTIONS IN SEMICONDUCTORS BY MEANS OF PROCESSING PARTICLE-BEAM-INDUCED SIGNALS IN A SCANNING CORPUSCULAR MICROSCOPE

[75] Inventors: Hans Rehme, Zorneding; Helmut Schink, Munich, both of Fed. Rep. of Germany

[73] Assignee: Siemens Aktiengesellschaft, Berlin and Munich, Fed. Rep. of Germany

[21] Appl. No.: 599,713

[22] Filed: Apr. 12, 1984

[30] Foreign Application Priority Data

Apr. 14, 1983 [DE] Fed. Rep. of Germany ....... 3313597

[51] Int. Cl.⁴ ................... H01J 37/26; G01N 23/22
[52] U.S. Cl. ................... 364/527; 250/311; 250/398; 364/552; 364/490
[58] Field of Search ............... 364/563, 552, 488–491, 364/300, 527, 525; 250/311, 307, 398

[56] References Cited

U.S. PATENT DOCUMENTS

| | | | |
|---|---|---|---|
| 3,772,520 | 11/1973 | Varker | 250/311 X |
| 3,879,613 | 4/1975 | Scott et al. | 250/398 X |
| 4,089,054 | 5/1978 | Ott | 364/527 |
| 4,136,285 | 1/1979 | Anger et al. | 250/398 X |
| 4,253,154 | 2/1981 | Russ et al. | 250/311 X |
| 4,433,384 | 2/1984 | Berrian et al. | 364/490 X |
| 4,438,336 | 3/1984 | Riecke | 250/311 X |
| 4,480,188 | 10/1984 | de Azevedo | 250/311 X |
| 4,510,387 | 4/1985 | Izumi et al. | 250/307 X |

*Primary Examiner*—Edward J. Wise
*Attorney, Agent, or Firm*—Hill, Van Santen, Steadman & Simpson

[57] ABSTRACT

A method for high-precision imaging of electrical barrier layers (pn-junctions) in semiconductors by means of processing particle beam induced signals created during scanning with a corpuscular microscope, even when the electrical barrier layers are aligned perpendicularly or obliquely relative to a specimen surface. The path of the pn-junctions in cross-sections through semiconductor components may be identified with a high reliability such as within 0.1 μm. Specific point (P(x,y), P(x+Δx, y+Δy), M(x,y), N(x,y), F(x,y)) is defined and particle beam induced signals generated along a scan line containing this specific point is compared with reference to particle beam induced signals generated along a further scanning line containing a point within a certain environment of the specific point first chosen with the comparison results being used to localize the electric barrier region profile.

7 Claims, 9 Drawing Figures

METHOD FOR IMAGING ELECTRICAL BARRIER LAYERS SUCH AS PN-JUNCTIONS IN SEMICONDUCTORS BY MEANS OF PROCESSING PARTICLE-BEAM-INDUCED SIGNALS IN A SCANNING CORPUSCULAR MICROSCOPE

BACKGROUND OF THE INVENTION

The invention relates to a method for imaging electrical barrier layers such as pn junctions in semiconductors by means of processing particle-beam-induced signals in a scanning corpuscular microscope.

Precise knowledge of the potential distribution or dopant distribution in the inside of the semiconductor crystal is of significance for the development of VLSI components. Depth-dependent dopant profiles can be calculated by means of computer simulation or, for example, can be measured by means of secondary ion mass spectrometry (SIMS). The depth of a pn-junction can be identified by means of electrical measurements.

Due to increasing miniaturization, however, lateral effects produced by scattering or diffusion of the dopant, for example under-diffusion at mask edges, are also of great significance. The measurement of these lateral effects with sufficiently high topical resolution (approximately 0.1 μm) is a hitherto unresolved problem.

It is known to image pn-junctions with the assistance of the induced current in a scanning electron microscope (EBIC: electron beam induced current). The definition of a pn-junction, however, cannot be represented with the required precision given such a known method.

SUMMARY OF THE INVENTION

An object of the present invention is to specify a method of the type initially cited which also enables the imaging of electrical barrier layers, for example pn-junctions, in semiconductors with very high precision even when these electric barrier layers are aligned perpendicularly or obliquely relative to the surface of the specimen. For example, the course of pn-junctions should be identified in cross-sections through semiconductor components with an uncertainty of at most 0.1 μm.

This object is achieved by defining specific image-points having defined properties with respect to their surrounding using these properties for the localization of the barriers.

DESCRIPTION OF THE PREFERRED EMBODIMENTS

Figure 1:
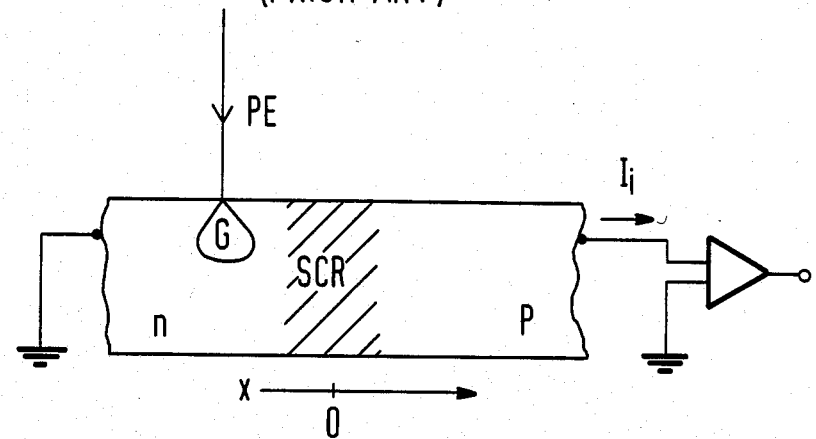
FIG. 1 shows a prior art arrangement for imaging a pn-junction with the assistance of an induced test current (EBIC)

FIG. 1 shows an arrangement for imaging a pn-junction with the assistance of the induced specimen or test current (EBIC) in a scanning electron microscope as well as the wiring of the specimen. Primary electrons PE having an energy of, for example, 20 keV penetrate into the specimen. The primary electrons PE are thus scattered and lose their energy in a volume G assumed to be spherical in FIG. 1. The primary electrons PE create electron hole pairs in this "scatter volume" G due to ionization. When the scatter volume is situated at a sufficiently great distance from the pn-junction, the electrons and holes recombine on the average after they have traversed a path corresponding to their respective diffusion length.

When the primary electron beam moves across the specimen surface in the x-direction and approaches the pn-junction, then finally diffused charge carriers proceed into the range of influence of the electrical field of the space charge region SCR. The respective minority carriers are accelerated by this electrical field to the respective other side of the pn-junction (electrons to the n-side, holes to the p-side). Given a closed external circuit, a "charge separation current" $I_i$ (EBIC) is present, this being measured, amplified and, for example, used for brightness modulation of the picture tube of the scanning electron microscope.

Figure 2:
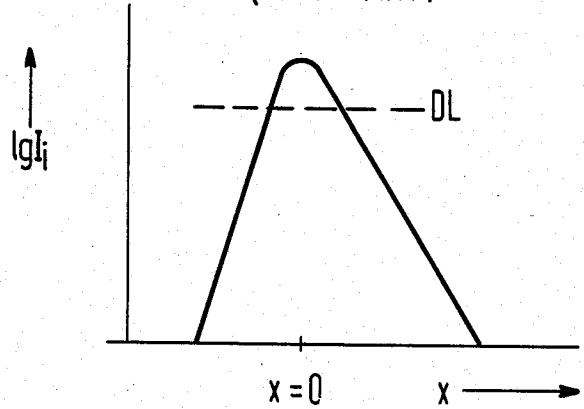
FIG. 2 schematically shows the result of a line scan perpendicular to the pn-junction with the prior art arrangement according to FIG. 1.

FIG. 2 schematically shows the result of a line scan perpendicular to the pn-junction. The charge separation current $I_i$ is illustrated in a logarithmic scale in FIG. 2. At a sufficiently great distance from the pn-junction, the curve progression of the charge separation current $I_i$ is described by $$I_i = I_{im} \exp(-|x|/L)$$

($I_i$ denotes induced specimen current of EBIC; $I_{im}$ denotes the greatest possible value of $I_i$; L denotes the diffusion length of the respective minority carriers).

For small absolute values of x, the scatter volume G and the space charge region SCR overlap and the above equation for the charge separation current $I_i$ is in fact invalid. In particular, $I_i(x=0)$ is usually smaller than $I_{im}$. The actual size of the induced current at the pn-junction depends on the diameter of the scatter volume G, on the width of the space charge region SCR, and on the influence of the surface recombination.

Knowledge of the size of the charge separation current $I_i$ is not required in order to localize a pn-junction. One can first proceed on the basis that the particle beam induced signal $I_i$ is greatest at the pn-junction, i.e. at the location of the greatest field strength. This certainly applies to a given symmetrical field distribution. It is then only necessary to find that location at which the charge separation current exhibits its maximum value. The exponential paths or variations of the charge separation current $I_i$ at both sides of the pn-junction can therefore be electronically suppressed in an inventive manner. A dark level setting that suppresses the exponential paths of the charge carrier current $I_i$ for values below a specific value DL is employed therefor. As a result, the pn junctions appear in imagings as narrow, bright lines. Fluctuations of the maximum charge separation current $I_i$ during the scanning of a pn-junction limit the applicability of this method. More far-reaching measuring methods according to this invention are proposed with reference to the following Figures in order to suppress the influence of these irregularities and in order to enable an even more precise localization.

The charge separation current $I_i$ can be represented as an EBIC profile $I_i(x)$, as shown in FIG. 2, or as a two-dimensional EBIC imaging $I_i(x,y)$. In order to obtain a two-dimensional EBIC imaging $I_i(x,y)$, the brightness of the picture tube of the scanning electron microscope is controlled with the assistance of the charge separation current $I_i(x,y)$. A bright line appears along the pn-junction, its width depending on the charge separation current profile and the corresponding level DL for the suppression of the exponential portions of the charge separation current profile.

Figure 3:
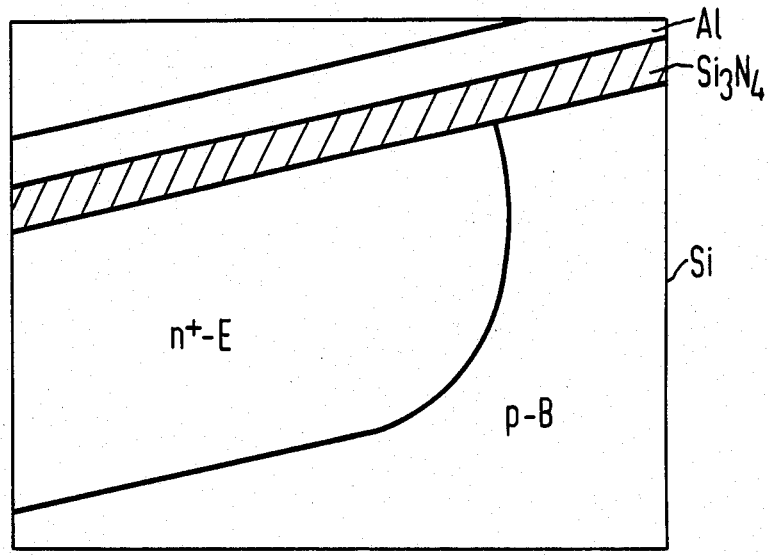
FIGS. 3 to 5 illustrate the principle underlying the invention enabling a locating of a pn-junction with required precision.
Figure 4:
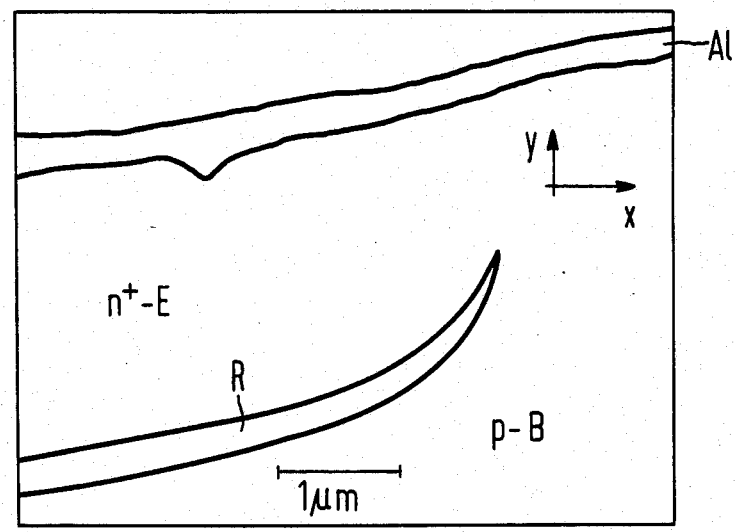
Figure 5:
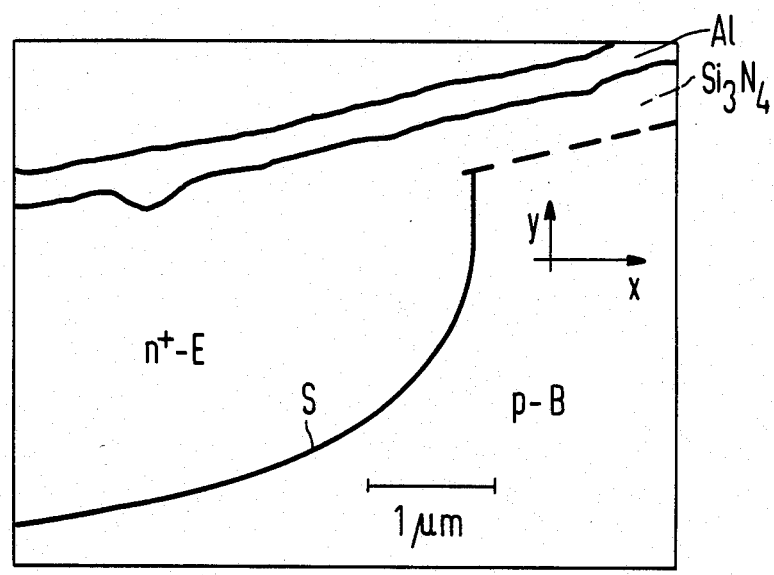

FIGS. 3, 4, and 5 schematically show a specimen produced in silicon gate technology. The silicon substrate covered with a $Si_3N_4$ layer is coated with an aluminum layer Al. FIGS. 3, 4 and 5 show an emitter $(n^+-E)$/base (p-B) junction. The EBIC signal $I_i$ disappears in the proximity of the $Si_3N_4$ passivation layer because the size of the maximum of the EBIC signal $I_i$ in the proximity of said passivation layer is lower than the level DL (see FIG. 2) due to the increased recombination at the boundary layer and, therefore, the EBIC signal $I_i$ is completely suppressed in the proximity of the passivation layer (FIG. 4). A reduction in the level DL (see FIG. 2) in FIG. 4 would lead to a further spread of the EBIC signal R in those regions of the pn-junction that are not adjacent to the passivation layer. As a result thereof, however, the locating of the pn-junction in these regions not adjacent to the passivation layer would become even more imprecise. In order to avoid these problems with effects of boundary layers and surfaces, and in order to obtain higher topical resolution, various methods are proposed below wherein the EBIC signal $I_i$ is processed with the assistance of a computer. For example, 324×243 points can be stored and processed with a 12-bit resolution given the assistance of a desktop calculator HP9826. After the entire two-dimensional EBIC image $I_i(x,y)$ has been written into the calculator, the maximums of the EBIC signal $I_i(x,y)$ can be identified. When the angle between the direction of the line scan and the pn-junction is not too small, the two-dimensional EBIC signal $I_i(x,y)$ can, for example, be identified line-by-line in the simplest case. Too small an angle between the scanning direction of the scanning probe and the pn-junction can usually be avoided by turning the specimen or the scanning direction of the scanning probe. The disruptive influence of noise can be suppressed with the assistance of a corresponding algorithm. Results identified with the assistance of the computer can be output on a plotter or on the picture screen of the scanning electron microscope. In the latter instance—as given known EBIC images—, a sub-region of the imaging can be generated with the assistance of secondary electrons, as shown in FIG. 5. In contrast to the illustration in FIG. 4, the pn-junction S in FIG. 5 is shown with constant contrast and with constant width over its entire length. The line width derives from the method used to generate the imaging. Since the maximum of the EBIC signal $I_i$ is not sharp, the digitization of the EBIC signal results in a plateau of about two or three points that correspond to a line width of about 50 nm in FIG. 5 for the maximum of said EBIC signal. An additional spread of the line width is caused by the digitization of the image field.

It is presumed with the employment of a computer that the scanning electron microscope has a digital scanning generator which, for example, allows 1000 lines per image and 1000 points per line to be employed. With a computer, the EBIC signal levels of all 1000 image points of the corresponding line would have to be deposited given every scan line. After the line scan, the computer must identify the point or—given a plurality of pn-junctions—the points of the highest EBIC signal and would mark it on the picture screen by means of a bright spot only. This marking can ensue by means of a rebound on the same line or at the next line scan. In the latter instance, the localization error given 5000× magnification would only amount to 20 nm and could be neglected.

Figure 6:
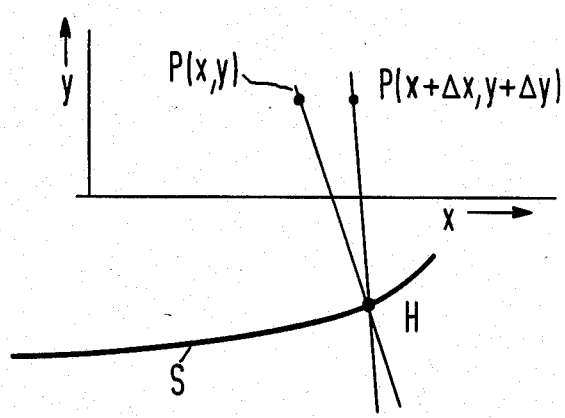
FIGS. 6 to 8 explain exemplary embodiments of the invention for the locating of electrical barrier regions.
Figure 7:
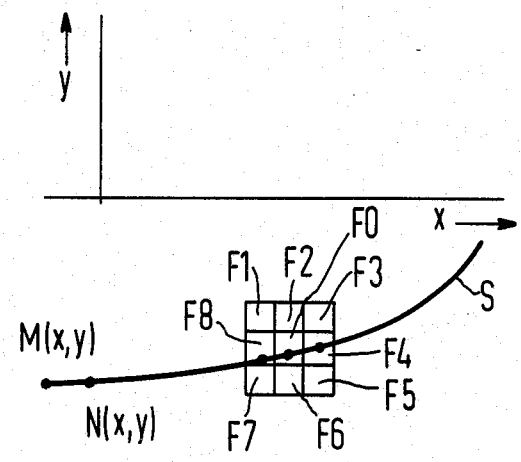
Figure 8:
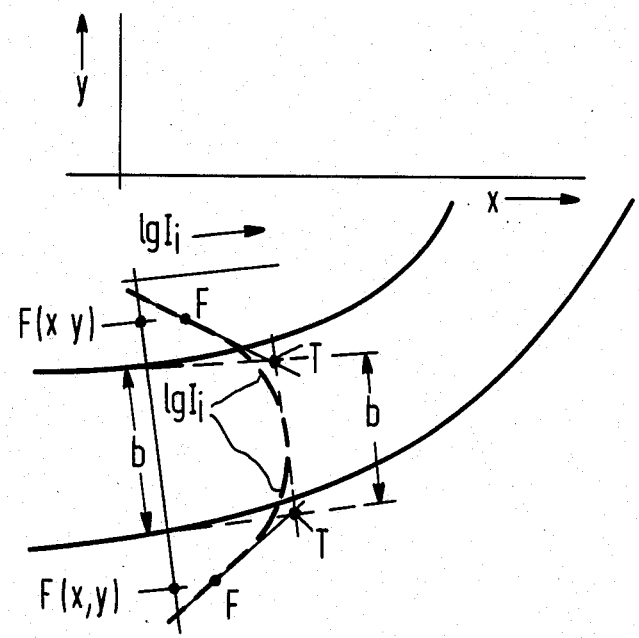

FIGS. 6, 7 and 8 show farther-reaching methods for the precise locating of electrical barrier regions. Given the method according to FIG. 6, for example, so-called contour lines, i.e. lines on the x-y plane that connect points at which the values of the EBIC signals approximately coincide to one another, can be identified by means of line-by-line scanning of the specimen surface and by means of corresponding roll-in of the resulting EBIC signals $I_i$ into a computer. The maximums in x-direction and y-direction can in turn be specified on the basis of these contour lines. These maximums can be employed as a $0^{th}$ approximation for the localization of a pn-junction S. In case the pn-junction exhibits curvatures, this pn-junction S can be divided into different regions, each of said regions exhibiting a more or less definable curvature with a more or less definable center of curvature. A respective point P(x,y) is defined in the proximity of such centers of curvature, a respective line being scanned proceeding from said point P(x,y) on, for instance, the shortest path over various points H that lie on the sub-region of the pn-junction S belonging to this center of curvature. An EBIC signal $I_i$ is recorded for each such line scan. The maximum is identified for each of said EBIC signals $I_i$. Averaging is therefore undertaken over a respective series of successively disposed points along each and every line scan in order to eliminate disruptive effects. The plurality of successively disposed points over which the respective averaging is carried out can thus be varied until the addition or the omission of a single point in the averaging produces practically no change of the result (when averaging) over a specific plurality of successively disposed points.

A further point $P(x+\Delta x, y+\Delta y)$ in the proximity of the point P(x,y) is then selected and one proceeds with said further point in accordance with the method described with respect to the point P(x,y). If a localization of the sub-region of the pn-junction belonging to this curvature region thereby results which coincides with that localization that had been found given the first method step proceeding from point P(x,y), then this localization of the sub-region of the pn-junction S is already reliable. If the two successively identified localizations of the sub-region of the pn-junction do not coincide with one another, then further points P in the proximity of a point utilized for the immediately preceding method step must be sought and employed for a further method step until at least two localizations of the sub-region of the pn-junction that were executed in immediate succession practically coincide.

Given the method according to FIG. 7, the absolute maximum of the values of the EBIC signal $I_i$ of the entire image is first identified. Fields are formed in the environs of this absolute maximum M(x,y) by means of combining respective neighboring points in order to eliminate disruptive effects. The mean value of the EBIC signal $I_i$ is identified for each of these fields. Since the absolute maximum $M(x,y)$ lies on the pn-junction S, that field around the point $N(x,y)$ that exhibits the second-highest value of the EBIC signal $I_i$ after the absolute maximum also lies on the pn-junction S. Proceeding from the field around the point $N(x,y)$, a further field is then sought whose value of the EBIC signal $I_i$ exhibits the highest value of all EBIC signals $I_i$ identified in the immediate proximity of the point $N(x,y)$, whereby the values of points that have already been identified as belonging to the pn-junction S may no longer be taken into consideration. Always proceeding from the most recently identified point on the pn-junction S, the entire course of the pn-junction S can be successively defined in this manner. Fields $F_0$ through $F_8$ shown in FIG. 7 are explained later.

The size of the fields of points over which averaging is respectively carried out is varied until the addition or omission of a point from such a field no longer changes the localization of the pn-junction S.

FIG. 8 explains a further method for that case in which the width of the space charge region SCR is great in comparison to the diameter of the scatter volume G. The EBIC profile $I_i$ exhibits a plateau in this case. The constancy of the plateau value of the EBIC signal $I_i$ within the space charge region SCR is first monitored over a certain region of the pn-junction by means of a number of line scans. The measured EBIC signals $I_i$ are logarithmized at every line scan. The exponential portions of the EBIC signal $I_i$ thereby become approximately straight lines. The points F on the logarithmized signal $I_i$ at which the logarithmized signal $I_i$ exhibits just about linear edges are identified for every line scan on the rising and on the falling edge of the EBIC signal $I_i$. The slope of the logarithmized signal $I_i$ at said points F is then identified in two-dimensional fashion. With these identified slopes, straight lines are placed through the points F on the logarithmized signal $I_i$, said straight lines exhibiting two intersections T with a further horizontal line proceeding through the maximum of the logarithmized signal $I_i$. Via their spacing b, these intersections T define the width b of the pn-junction.

The foregoing has always been based on the assumption that the maximum of the signal $I_i$ coincides with the pn-junction. This assumption is met as long as the electrical field in the space charge region SCR is symmetrical and as long as the diffusion lengths of the respective minority charge carriers are of comparable size. When, however, the dopant concentrations in the n-region and p-region differ greatly, as is usually the case, the electrical field distribution is asymmetrical and the diffusion lengths are different. The maximum of the EBIC signal $I_i$ and the pn-junction then do not exactly coincide.

In the example from FIGS. 2, 4, and 5 (where the emitter dopant concentration is $10^{20}$ cm$^{-3}$ and the base dopant concentration is $10^{18}$ cm$^{-3}$, a deviation $\Delta x$ of the pn-junction from the maximum of the EBIC signal $I_i$ is about 10 nm. This means that the true emitter/base junction is negligibly shifted toward the emitter. In order to keep this error $\Delta x$ as small as possible, the scatter volume G should be as small as possible. For this purpose, one must work with the lowest possible acceleration voltage for the primary electrons PE.

Fields F0 through F8 are indicated in FIG. 7. Each of the fields F0 through F8 supplies a value of the EBIC signal $I_i$ that has been averaged over the scanning points contained in the respective field. The values for the fields F0 and F8 are not taken into consideration because they have already been identified as belonging to the barrier region. Of the remaining fields F1 through F7, the field F4 exhibits the highest mean value for the EBIC signal $I_i$. Thus, the field F4 also belongs to the electrical barrier region.

Figure 9:
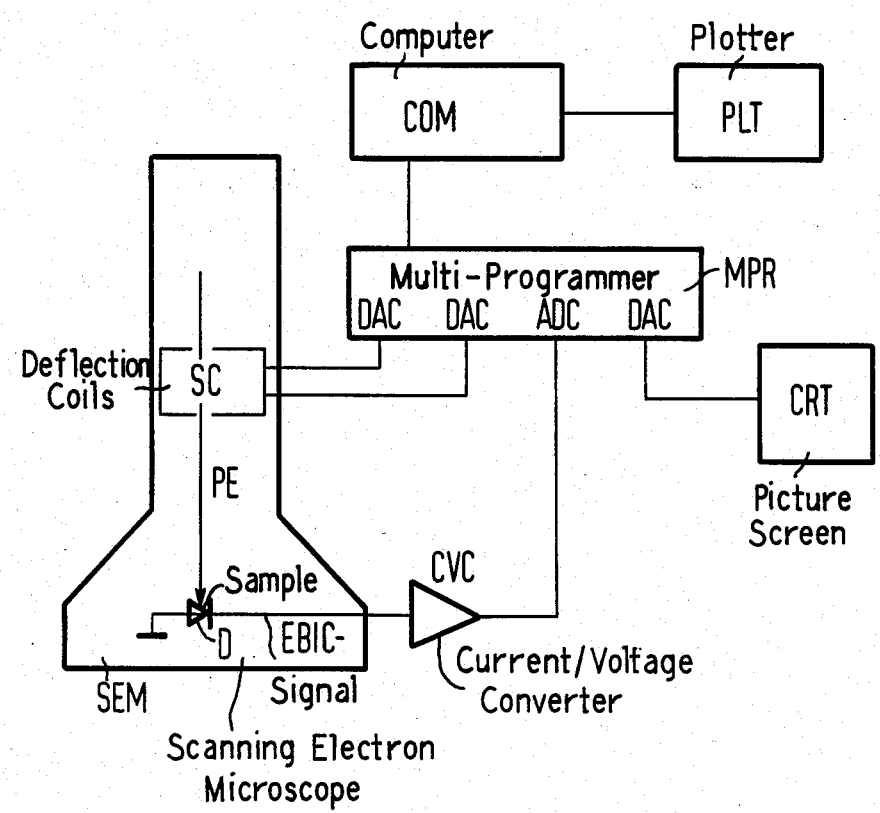
FIG. 9 illustrates a block diagram of an arrangement for performing the method according to the invention.
Figure 10:
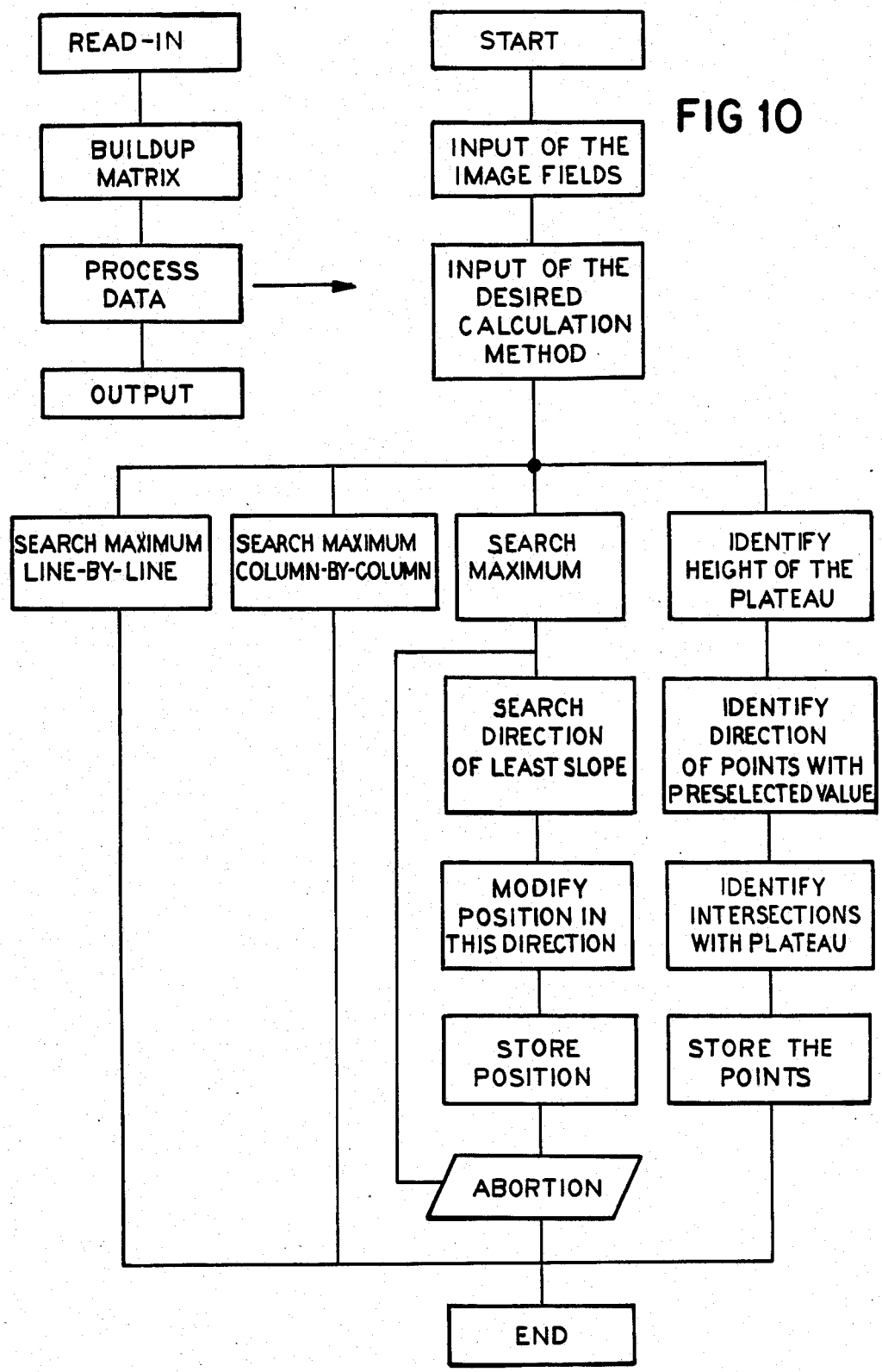
FIG. 10 illustrates a flow chart of the computer program attached herewith as Appendix A.

FIG. 9 shows a block diagram of an arrangement for the execution of the method according to the invention. In a scanning electron microscope SEM (Cambridge Stereo Scan S150), the primary electrons PE penetrate into the sample D. The sample D is shown as a diode in FIG. 9. Given a closed external circuit, a "charge separation current" EBIC flows. This EBIC signal is converted into a voltage signal in a current/voltage converter CVC (Keithley 427). This voltage signal is supplied over an analog-to-digital converter ADC to a multi-programmer MPR (HP 6940B). These test signals are processed in a computer COM (HP 9826A). The processing of the test signals in the computer COM is controlled, for example, via the program attached in the appendix A to the application and fully incorporated herein. Test results can be displayed via a plotter PLT (HB 9872A). The deflection of the primary electrons PE is likewise controlled by the computer COM. For this purpose, signals are communicated to the deflection coils SC of the scanning electron microscope SEM via digital-to-analog converters DAC which is associated with the multi-programmer MPR. Test results can also be represented on the picture screen CRT which, for example, is associated with the scanning electron microscope SEM, being represented thereon via a further digital-to-analog converter DAC that likewise is associated with the multi-programmer MPR.

Additional details concerning the construction of the measuring arrangement according to FIG. 9 are contained in the publication "Mapping Of PN-Junctions And Depletion Layers By Computer Processed EBIC Signals" published by the inventors after the filing date of the corresponding German application No. P 33 13 597.5 filed Apr. 14, 1983 and incorporated herein by reference. Of particular interest is page 2, second paragraph and page 3 the last two paragraphs.

Although various minor changes and modifications might be proposed by those skilled in the art, it will be understood that we wish to include within the claims of the patent warranted hereon all such changes and modifications as reasonably come within our contribution to the art.

APPENDIX A

```
10    ! EBIC
20    !
30    INTEGER I,J,Slot_x,Slot_y,Slot_r,Slot_inp,Point(0:1940),Line(0:324),Zeile,
Anfz,Endz,Dist,R,X
40    INTEGER Signal(0:243,0:324),Vsignal(0:243,0:324),Logsignal(0:243,0:324)
50    !
60    !
70 Neu: !
80    INPUT "NEUE DISKETTE",B$
90    IF B$="J" THEN CREATE BDAT "Image",250,700
100   INPUT "WEITERE DISKETTE?",B$
110   IF B$="J" THEN GOTO Neu
120   !
130   ASSIGN @Speicher TO "Image"
140   !
150   Slot_x=-8192          ! Slot 14
160   Slot_y=-12288         ! Slot 13
170   Slot_r=4096           ! Slot  1
180   Slot_inp=28672        ! Slot  7
190   Slot_vinp=20480       ! Slot  5
200   Slot_bout=-32768      ! Slot  8
210   !
220   !
230   GCLEAR
240   PRINT CHR$(12)
250   FOR I=0 TO 324
260      Point(I)=Slot_x+I*6
270   NEXT I
280   FOR I=0 TO 243
290      Line(I)=Slot_y+I*8
300   NEXT I
310   !
320   !
330   ON KEY 0 LABEL "AUSDRUCK",4 GOSUB Ausdruck
340   ON KEY 1 LABEL "AUFNAHME",4 GOSUB Aufnahme
350   ON KEY 2 LABEL "SPEICHER",4 GOSUB Store
360   ON KEY 3 LABEL "  PLOT",4 GOSUB Plot
370   ON KEY 4 LABEL "AUSGABE",4 GOSUB Bausgabe
380   ON KEY 5 LABEL "EINLESEN",4 GOSUB Recall
390   ON KEY 6 LABEL " ANALOG",4 GOSUB Analog
400   ON KEY 7 LABEL "MAXSUCHE",4 GOSUB Maxsuche
410   ON KEY 8 LABEL "  RLZ",4 GOSUB Rlz
420   ON KEY 9 LABEL "MARKEN",4 GOSUB Marken
430   ON KEY 10,4 GOSUB Logar
440   ON KEY 11,4 GOSUB Space
441   ON KEY 12,4 GOSUB Subtr
450   ON KEY 16,4 GOSUB Vfarbe
460   ON KEY 17,4 GOSUB Vfarbe_7
470   !
480   !
490 Loop:!
500   GOTO Loop
510   !
511 Subtr: !
512   !
513   !
514   DISP "BITTE WARTEN..."
515   !
516   FOR I=0 TO 243
517      FOR K=0 TO 324
518      Signal(I,K)=Signal(I,K)-Vsignal(I,K)
519      NEXT K
520   NEXT I
521   !
522   FOR N=1 TO 20
523   BEEP RND*2000,RND/4
524   NEXT N
526   !
527   RETURN
528   !
529   !
```

```
530 Logar:  !
540   !
550    INPUT "OFFSET",Offset
560    PRINT "OFFSET:";Offset
570    !
580    DISP "BITTE WARTEN...   (CA.6 MINUTEN)"
590    FOR I=0 TO 243
600      FOR K=0 TO 324
610        S=Signal(I,K)-Offset
620        IF S<1 THEN S=.00001
630        Logsignal(I,K)=INT(LGT(S)*1000)
640      NEXT K
650    NEXT I
660    !
670    PRINT "DAS BILD IST LOGARITHMIERT !"
680    FOR N=1 TO 10
690    BEEP 3000*RND,RND/3
700    NEXT N
710    !
720    !
730    !
740    !
750 RETURN
760    !
770    !
780    !
790 Rlz:   !(INTEGER LOGSIGNAL(*))
800      !
810      !
820      BEEP
830      INTEGER K,L,M,P,T,U
840      !
850      PRINT CHR$(12)
860      DISP "BITTE WARTEN..."
870      !
880      FOR J=0 TO 243
890        FOR K=0 TO 324
900          Vsignal(J,K)=2200
910        NEXT K
920      NEXT J
930      !
940      !
950      GINIT
960      GRAPHICS ON
970      WINDOW 0,324,0,243
980      FRAME
990      !
1000     !
1010     INPUT "NIVEAU DES PLATEAU ?",Imax
1020     INPUT "SCHWELLE ?",Schw
1030     INPUT "TOLERANZBEREICH ?",Di
1040     PRINT "PLATEAU:";Imax,"SCHWELLE:";Schw,"TOLERANZ:";Di
1050     INPUT "FELDGRÖßE ?",X
1060     INPUT "RADIUS ?",R
1070     PRINT "FELDGRÖßE:";2*X+1;"x";2*X+1;"PUNKTE","RADIUS";R
1080     FOR I=X+R TO (242-X-R)
1090       FOR K=X+R TO (323-X-R)
1100         IF Logsignal(I,K)>1000*LGT(Schw) AND Logsignal(I,K)<1000*LGT(Schw+Di) THEN
1110           !
1120           !
1130           I0=0
1140           FOR L=-X TO X
1150             FOR M=-X TO X
1160               I0=I0+Logsignal(I+L,K+M)
1170             NEXT M
1180           NEXT L
1190           !
1200           Stmax=0
1210           DEG
1220           !
1230           !
1240           FOR P=0 TO 359 STEP 30
```

```
1250        I1=INT(R*SIN(P))
1260        K1=INT(R*COS(P))
1270        I2=0
1280        !
1290        !
1300        FOR L=-X TO X
1310          FOR M=-X TO X
1320            I2=I2+Logsignal(I+L+I1,K+M+K1)
1330          NEXT M
1340        NEXT L
1350        !
1360        !
1370        St=(I2-I0)/((((I1^2)+(K1^2))^.5)*(((2*X)+1)^2))
1380        IF St>Stmax THEN
1390                    Stmax=St
1400                    Pmax=P
1410        END IF
1420        !
1430        !
1440        NEXT P
1450        !
1460        !
1470        J=INT(((((1000*LGT(Imax))-I0/(((2*X)+1)^2))/Stmax)*SIN(Pmax))
1480        U=INT(((((1000*LGT(Imax))-I0/(((2*X)+1)^2))/Stmax)*COS(Pmax))
1490        !
1500        !
1510        IF I+T<0 OR I+T>243 OR K+U<0 OR K+U>324 THEN Nächster
1520        !
1530        !
1540        Vsignal(T+I,U+K)=2000
1550        MOVE U+K,243-T-I
1560        IDRAW 0,0
1570        !
1580        !
1590      END IF
1600      !
1610 Nächster:
1620      !
1630      NEXT K
1640    NEXT I
1650    !
1660    !
1670    FOR N=1 TO 10
1680    BEEP 3000*RND,RND/3
1690    NEXT N
1700    !
1710    !
1720    !
1730 RETURN
1740    !
1750    !
1760    !
1770    !
1780    !
1790    !
1800    !
1810 Marken: !
1820    !
1830    !
1840    GRAPHICS OFF
1850    ALPHA ON
1860    PRINT CHR$(12)
1870    !
1880    !
1890    DISP "DRÜCKEN SIE: RECORD FRAME 60 SECS. INPUT 3, SPOT, DATA OFF"
1900    FOR T=1 TO 10
1910    BEEP
1920    WAIT .2
1930    NEXT T
1940    DISP "BITTE WARTEN"
1950    OUTPUT 12 USING "#,W";-4000
1960    OUTPUT 12 USING "#,W";Slot_r+3072+512
1970    !
```

```
1980    Null=Slot_bout+2200
1990    !
2000    OUTPUT 12 USING "#,W";Null
2010    WAIT 5
2020    !
2030    FOR K=10 TO 314.1 STEP 304
2040      FOR J=0 TO 223.1 STEP 223
2050        FOR I=5 TO 15.1
2060          OUTPUT 12 USING "#,W";-4000,Line(I+J)
2070          OUTPUT 12 USING "#,W";-4000,Point(K),2000+Slot_bout,Null
2080        NEXT I
2090      NEXT J
2100    NEXT K
2110    !
2120    !
2130    FOR J=10 TO 233.1 STEP 223
2140      FOR K0=0 TO 304.1 STEP 304
2150        FOR K=5 TO 15.1
2160          OUTPUT 12 USING "#,W";-4000,Line(J)
2170          OUTPUT 12 USING "#,W";-4000,Point(K+K0),2000+Slot_bout,Null
2180        NEXT K
2190      NEXT K0
2200    NEXT J
2210    !
2220    WAIT 55
2230    !
2240    OUTPUT 12 USING "#,W";-4096
2250    DISP ""
2260    BEEP 1000,1
2270    !
2280    !
2290 RETURN
2300    !
2310    !
2320    !
2330 Aufnahme:!
2340    GRAPHICS OFF
2350    ALPHA ON
2360    PRINT CHR$(12)
2370    !
2380    INPUT "ZEIT PRO BILDPUNKT ?",T
2390    INPUT "SE-SIGNAL AUFZEICHNEN ? (J/N)",SS
2400    S=0
2410    IF SS="J" THEN
2420             S=512
2430             PRINT "RECORD DRÜCKEN"
2440             PRINT "RECORD FRAME 500Sec. !"
2450    END IF
2460    Dt=T-.00635
2470    IF Dt<0 THEN
2480             Dt=0
2490             T=.00635
2500    END IF
2510    PRINT "ZEIT PRO BILDPUNKT:";T;"SEKUNDEN"
2520    PRINT "ZEIT PRO BILD:";T*243*324/60;"MINUTEN"
2530    OUTPUT 12 USING "#,W";-4000    !SYE,DTE on
2540    OUTPUT 12 USING "#,W";Slot_r+3072+S    !Relais X,Y on
2550    !
2560    FOR I=0 TO 243
2570      OUTPUT 12 USING "#,W";-4000,Line(I) !SYE,DTE;Y_Wert
2580      FOR K=0 TO 324
2590        !
2600        WAIT Dt
2610        !
2620        OUTPUT 12 USING "#,W";-4000,Point(K),-3920,28672
2630        !SYE,DTE;X_wert;SYE,ISL,TME;Slot_inp
2640        STATUS 12,3;Signal(I,K)
2650      NEXT K
2660    NEXT I
2670    !
2680    OUTPUT 12 USING "#,W";-4096    !SYE off
2690    !
2700    !
```

```
2710      FOR I=0 TO 243
2720         FOR K=0 TO 324
2730            Signal(I,K)=SHIFT(SHIFT(Signal(I,K)+32768,-4),4)
2740         NEXT K
2750      NEXT I
2760      BEEP
2770      PRINT "EINLESEN BEENDET"
2780      !
2790   RETURN
2800   !
2810   !
2820 Bausgabe: !
2830      GRAPHICS OFF
2840      ALPHA ON
2850      PRINT CHR$(12)
2860      !
2870      INPUT "SIGNAL ODER VSIGNAL ? (1 ODER 2)",X
2880      DISP "BITTE WARTEN"
2890      OUTPUT 12 USING "#,W";-4000 !SYE.DTE on
2900      OUTPUT 12 USING "#,W";Slot_r+3072+512
2910      !
2920      Null=Slot_bout+2200
2930      !
2940      FOR I=0 TO 243
2950         OUTPUT 12 USING "#,W";-4000,Line(I)   !SYE.DTE:Y_WERT
2960         FOR K=0 TO 324
2970            IF X=1 THEN OUTPUT 12 USING "#,W";-4000,Point(K),Signal(I,K)+Slo
bout,Null
2980            IF X=2 THEN OUTPUT 12 USING "#,W";-4000,Point(K),Vsignal(I,K)+Sl
_bout,Null
2990         NEXT K
3000      NEXT I
3010      !
3020      OUTPUT 12 USING "#,W";-4096
3030      DISP ""
3040      BEEP
3050      !
3060      !
3070   RETURN
3080   !
3090   !
3100 Store:!
3110      GCLEAR
3120      !
3130      INPUT "SIGNAL, VSIGNAL ODER LOGSIGNAL ? (1, 2 ODER 3)",X
3140      !
3150      ASSIGN @Speicher TO "Image"
3160      IF X=1 THEN OUTPUT @Speicher;Signal(*)
3170      IF X=2 THEN OUTPUT @Speicher;Vsignal(*)
3180      IF X=3 THEN OUTPUT @Speicher;Logsignal(*)
3190      !
3200      BEEP
3210      IF X=1 THEN PRINT "BILD AUFGEZEICHNET!"
3220      IF X=2 THEN PRINT "VERGLEICHSBILD AUFGEZEICHNET!"
3230      IF X=3 THEN PRINT "LOGARITHMIERTES BILD AUFGEZEICHNET!"
3240      !
3250   RETURN
3260   !
3270   !
3280   !
3290 Analog: !
3300      BEEP 1000,.5
3310      !
3320      !
3330      GINIT
3340      GRAPHICS ON
3350      WINDOW 0,324,0,243
3360      FRAME
3370      !
3380      !
```

```
3450    !
3460    FOR J=0 TO 234                    ! ALLE V_signal WERTEN AUF NEGATIVE WERTE GESE
TZT
3470      FOR K=0 TO 324
3480        Vsignal(J,K)=2200
3490      NEXT K
3500    NEXT J
3510    !
3520    !
3530    !
3540    INPUT "SCHWELLEN VON... BIS...",Ymin,Ymax
3550    INPUT "SCHRITTWEITE ?",Z
3560    INPUT "TOLERANZBEREICH ?",Dy
3570    PRINTER IS 701
3580    PRINT "YMIN","YMAX","SCHRITT","DY"
3590    PRINT Ymin,Ymax,Z,Dy
3600    PRINTER IS 1
3610    !
3620    !
3630    !
3640    !
3650    FOR I=0 TO 234
3660      FOR K=0 TO 324
3670        !
3680        FOR Y=Ymin TO Ymax STEP Z
3690        !
3700        IF Signal(I,K)>(Y-1) AND Signal(I,K)<(Y+1+Dy) THEN
3710              MOVE K,(243-I)
3720              IDRAW 0,0
3730              Vsignal(I,K)=2000
3740        END IF
3750        !
3760        NEXT Y
3770        !
3780        !
3790      NEXT K
3800    NEXT I
3810    BEEP
3820    !
3830    !
3840    BEEP 500,.5
3850    BEEP 1000,.5
3860    BEEP 1500,.5
3870    !
3880    !
3890    !
3900    RETURN
3910    !
3920    !
3930    !
3940 Recall: !
3950        !
3960    INPUT "SIGNAL, VSIGNAL ODER LOGSIGNAL ? (1, 2 ODER 3)",X
3970    !
3980    ASSIGN @Speicher TO "Image"
3990    IF X=1 THEN ENTER @Speicher;Signal(*)
4000    IF X=2 THEN ENTER @Speicher;Vsignal(*)
4010    IF X=3 THEN ENTER @Speicher;Logsignal(*)
4020    BEEP
4030    IF X=1 THEN PRINT "BILD VON DER DISKETTE EINGELESEN"
4040    IF X=2 THEN PRINT "VERGLEICHSBILD VON DER DISKETTE EINGELESEN"
4050    IF X=3 THEN PRINT "LOGARITHMIERTES BILD VON DER DISKETTE EINGELESEN"
4060    RETURN
4070    !
4080    !
4090    !
4100 Plot: !
4110    !
4120    INPUT "SIGNAL, VSIGNAL ODER LOGSIGNAL ? (1, 2 ODER 3)",X
4130    INPUT "WELCHE ZEILE",Zeile
4140    GCLEAR
4150    ALPHA OFF
4160    GRAPHICS ON
4170    PEN 2
```

```
4180    !
4190    !
4200    VIEWPORT 0,RATIO*100,20,100
4210    A=2
4220    IF X=3 THEN A=3.5
4230    WINDOW 0,324,0,A
4240    AXES 10,1
4250    FOR K=0 TO 324
4260       IF X=1 THEN DRAW K,Signal(Zeile,K)*.001
4270       IF X=2 THEN DRAW K,Vsignal(Zeile,K)*.001
4280       IF X=3 THEN DRAW K,Logsignal(Zeile,K)*.001
4290    NEXT K
4300    PRINT CHR$(12)
4310    ALPHA ON
4320    PEN 0
4330    !
4340  RETURN
4350  !
4360  !
4370  !
4380 Maxsuche: !
4390    DISP "BITTE WARTEN"
4400    Maxsuch(Signal(*),Vsignal(*),324,243)
4410    DISP "MAXIMUMBILD BERECHNET"
4420    BEEP 500,5
4430  RETURN
4440  !
4450  !
4460 Space: !
4470    GCLEAR
4480    !
4490    INPUT "SIGNAL, VSIGNAL ODER LOGSIGNAL ? (1, 2 ODER 3)",X
4500    INPUT "ANFANGSZEILE",Anfz
4510    INPUT "ENDZEILE",Endz
4520    INPUT "SCHRITTWEITE",Dist
4530    ALPHA OFF
4540    GRAPHICS ON
4550    PEN 4
4560    VIEWPORT 0,RATIO*100,20,100
4570    WINDOW -30,539,-.2,16.7
4580    AXES 100,2
4590    DEG
4600    PIVOT 2,2
4610    DRAW 229.3,0
4620    PIVOT 0
4630    !
4640    PEN 2
4650    Lmax=.4
4660    F_x=Lmax*529
4670    F_z=Lmax*16.7
4680    !
4690    M=0
4700    L_x=1/INT((Endz-Anfz)/Dist+1)
4710    L_z=1/(INT((Endz-Anfz)/Dist)-1)
4720    FOR J=Endz TO (Anfz+Dist-1) STEP (-Dist)
4730       IF X=1 THEN MOVE M*L_x*F_x,Signal(J,0)*.005+M*L_z*F_z
4740       IF X=2 THEN MOVE M*L_x*F_x,Vsignal(J,0)*.005+M*L_z*F_z
4750       IF X=3 THEN MOVE M*L_x*F_x,Logsignal(J,0)*.005+M*L_z*F_z
4760       FOR K=1 TO 324
4770          IF X=1 THEN DRAW K+M*L_x*F_x,Signal(J,K)*.005+M*L_z*F_z
4780          IF X=2 THEN DRAW K+M*L_x*F_x,Vsignal(J,K)*.005+M*L_z*F_z
4790          IF X=3 THEN DRAW K+M*L_x*F_x,Logsignal(J,K)*.005+M*L_z*F_z
4800       NEXT K
4810       M=M+1
4820    NEXT J
4830    PRINT CHR$(12)
4840    ALPHA ON
4850    PEN 0
4860    !
4870  RETURN
4880  !
4890  !
4900  !
```

```
4910 Farbe:!
4920     PRINT CHR$(12)
4930     GCLEAR
4940     CALL Coulor(Signal(*))
4950  RETURN
4960  !
4970  !
4980  !
4990 Farbe_7:!
5000     PRINT CHR$(12)
5010     GCLEAR
5020     CALL Coulor_7(Signal(*))
5030  RETURN
5040  !
5050  !
5060  !
5070  !
5080 Vfarbe:!
5090     PRINT CHR$(12)
5100     GCLEAR
5110     CALL Coulor(Vsignal(*))
5120     DISP "VERGLEICHSBILD"
5130     WAIT 10
5140  RETURN
5150  !
5160  !
5170  !
5180 Vfarbe_7:!
5190     PRINT CHR$(12)
5200     GCLEAR
5210     CALL Coulor_7(Vsignal(*))
5220     DISP "VERGLEICHSBILD"
5230     WAIT 10
5240  RETURN
5250  !
5260  !
5270  !
5280  !
5290 Ausdruck:   !
5300             INPUT "SIGNAL, VSIGNAL ODER LOGSIGNAL ? (1, 2 ODER 3)",V
5310             INPUT "ZEILE",I
5320             INPUT "SCHRITTWEITE",S
5330             FOR K=1 TO 324 STEP S
5340             IF V=1 THEN PRINT I,K,Signal(I,K)
5350             IF V=2 THEN PRINT I,K,Vsignal(I,K)
5360             IF V=3 THEN PRINT I,K,Logsignal(I,K)
5370             NEXT K
5380 RETURN
5390 Ende: !
5400   END
5410  !
5420  !
5430  !
5440  !
5450   SUB Coulor(INTEGER Signal(*))
5460     !
5470     !
5480     INTEGER I,J,K,L,M,N,Pen(1:4)
5490     INTEGER Coul_1(1:7500),Coul_2(1:7500),Coul_3(1:7500),Coul_4(1:7500)
5500     REAL Level(0:4)
5510     DIM Farbe$(1:4)[10]
5520     READ Farbe$(*)
5530     DATA "schwarz","rot","grün","blau"
5540     ASSIGN @Pr TO 701
5550     !
5560     OFF KEY 0
5570     ON KEY 1 LABEL "NEU",8 GOSUB Neu
5580     ON KEY 2 LABEL "SPEICHER",8 GOSUB Store
5590     OFF KEY 3
5600     OFF KEY 4
5610     ON KEY 5 LABEL "EINLESEN",8 GOSUB Einlesen
5620     ON KEY 6 LABEL "  CRT",8 GOSUB Crt
5630     OFF KEY 7
```

```
5640      OFF KEY 8
5650      ON KEY 9 LABEL "EXIT",9 GOTO Ende
5660      !
5670      !
5680      !
5690 Loop: !
5700      GOTO Loop
5710      !
5720      !
5730      !
5740 Store:   !
5750      INPUT "WOLLEN SIE DIE ALTEN DATEN ÜBERSCHREIBEN?",B$
5760      IF B$<>"J" THEN GOTO Ret
5770      INPUT "NEUE DISKETTE?",B$
5780      IF B$="J" THEN
5790                  CREATE BDAT "Farben",1,100
5800                  CREATE BDAT "Farbe_1",1,15200
5810                  CREATE BDAT "Farbe_2",1,15200
5820                  CREATE BDAT "Farbe_3",1,15200
5830                  CREATE BDAT "Farbe_4",1,15200
5840      END IF
5850      !
5860      ASSIGN @Sp TO "Farben"
5870      ASSIGN @Sp_1 TO "Farbe_1"
5880      ASSIGN @Sp_2 TO "Farbe_2"
5890      ASSIGN @Sp_3 TO "Farbe_3"
5900      ASSIGN @Sp_4 TO "Farbe_4"
5910      !
5920      OUTPUT @Sp;Pen(*)
5930      OUTPUT @Sp_1;Coul_1(*)
5940      OUTPUT @Sp_2;Coul_2(*)
5950      OUTPUT @Sp_3;Coul_3(*)
5960      OUTPUT @Sp_4;Coul_4(*)
5970      !
5980      BEEP
5990      PRINT "ABSPEICHERN BEENDET"
6000      !
6010 Ret:    !
6020      RETURN
6030      !
6040      !
6050      !
6060 Einlesen: !
6070      ASSIGN @Sp TO "Farben"
6080      ASSIGN @Sp_1 TO "Farbe_1"
6090      ASSIGN @Sp_2 TO "Farbe_2"
6100      ASSIGN @Sp_3 TO "Farbe_3"
6110      ASSIGN @Sp_4 TO "Farbe_4"
6120      !
6130      ENTER @Sp;Pen(*)
6140      ENTER @Sp_1;Coul_1(*)
6150      ENTER @Sp_2;Coul_2(*)
6160      ENTER @Sp_3;Coul_3(*)
6170      ENTER @Sp_3;Coul_4(*)
6180      !
6190      BEEP
6200      PRINT "BILDER EINGELESEN"
6210      !
6220      RETURN
6230      !
6240      !
6250      !
6260 Neu: !
6270      PRINT "BITTE LEGEN SIE DIE REIHENFOLGE DERFARBEN FEST"
6280      PRINT "SCHWARZ   =   1"
6290      PRINT "ROT       =   2"
6300      PRINT "GRÜN      =   3"
6310      PRINT "BLAU      =   4"
6320      !
6330      PRINT
6340      FOR I=1 TO 4
6350         PRINT "FARBE",I
6360         INPUT Pen(I)
```

```
6370      NEXT I
6380      BEEP
6390      PRINT CHR$(12)
6400      PRINT "BITTE LEGEN SIE DIE SIGNALPEGEL FEST"
6410      PRINT
6420      FOR I=1 TO 3
6430         PRINT "LEVEL",I
6440         INPUT Level(I)
6450      NEXT I
6460      Level(0)=-1
6470      Level(4)=20
6480      PRINT CHR$(12)
6490      OUTPUT @Pr USING """"          DATEN""","/"
6500      OUTPUT @Pr:"            ";Farbe$(Pen(1))
6510      FOR I=2 TO 4
6520         OUTPUT @Pr:"            ";Farbe$(Pen(I)),"Level = ";Level(I-1)
6530      NEXT I
6540      PRINT
6550      !
6560      !
6570      VIEWPORT 0,RATIO*327*.25,15,246/3+15
6580      WINDOW -1,325,244,-1
6590      FRAME
6600      PEN 1
6610      FRAME
6620      !
6630      FOR J=1 TO 4
6640         DISP "FARBE:   ",Farbe$(Pen(J))
6650         PEN (Pen(J))
6660         FOR I=0 TO 243
6670            FOR K=0 TO 324
6680               MOVE K,I
6690               Sig=Signal(I,K)*.005
6700               IF Sig>Level(J) AND Sig<10.5 THEN IDRAW 0,0
6710            NEXT K
6720         NEXT I
6730         !
6740         SELECT J
6750            CASE 1
6760               GSTORE Coul_1(*)
6770            CASE 2
6780               GSTORE Coul_2(*)
6790            CASE 3
6800               GSTORE Coul_3(*)
6810            CASE 4
6820               GSTORE Coul_4(*)
6830         END SELECT
6840         GCLEAR
6850         FRAME
6860      NEXT J
6870      PEN 0
6880      BEEP 1200,2
6890      PRINT "VERARBEITUNG ABGESCHLOSSEN!"
6900      RETURN
6910      !
6920      !
6930 Crt: !
6940      INPUT "GEWÜNSCHTE FARBE",I
6950      SELECT I
6960         CASE 1
6970            GLOAD Coul_1(*)
6980         CASE 2
6990            GLOAD Coul_2(*)
7000         CASE 3
7010            GLOAD Coul_3(*)
7020         CASE 4
7030            GLOAD Coul_4(*)
7040      END SELECT
7050      DISP Farbe$(Pen(I))
7060      !
7070      RETURN
7080      !
7090      !
```

```
7100     !
7110 Ende: !
7120     SUBEND    !Coulor
7130     !
7140     !
7150     !
7160 SUB Coulor_7(INTEGER Signal(*))
7170     !
7180     !
7190     INTEGER I,J,K,L,M,N,Pen(1:7)
7200     REAL Level(0:7)
7210     DIM Farbe$(1:9)[10]
7220     READ Farbe$(*)
7230     DATA "schwarz","rot","grün","blau","","","braun","violett","orange"
7240     ASSIGN @Pr TO 701
7250     !
7260     OFF KEY 0
7270     ON KEY 1 LABEL "NEU",8 GOSUB Neu
7280     OFF KEY 2
7290     OFF KEY 3
7300     OFF KEY 4
7310     OFF KEY 5
7320     OFF KEY 6
7330     OFF KEY 7
7340     OFF KEY 8
7350     ON KEY 9 LABEL "EXIT",9 GOTO Ende
7360     !
7370     !
7380     !
7390 Loop: !
7400     GOTO Loop
7410     !
7420     !
7430     !
7440     !
7450     !
7460 Neu: !
7470     PRINT "BITTE LEGEN SIE DIE REIHENFOLGE DERFARBEN FEST"
7480     PRINT "SCHWARZ  =  1"
7490     PRINT "ROT      =  2"
7500     PRINT "GRÜN     =  3"
7510     PRINT "BLAU     =  4"
7520     PRINT "BRAUN    =  7"
7530     PRINT "VIOLETT  =  8"
7540     PRINT "ORANGE   =  9"
7550     !
7560     PRINT
7570     FOR I=1 TO 7
7580         PRINT "FARBE",I
7590         INPUT Pen(I)
7600     NEXT I
7610     BEEP
7620     PRINT CHR$(12)
7630     PRINT "BITTE LEGEN SIE DIE SIGNALPEGEL FEST"
7640     PRINT
7650     FOR I=1 TO 6
7660         PRINT "LEVEL";
7670         INPUT Level(I)
7680     NEXT I
7690     Level(0)=-1
7700     Level(7)=20
7710     PRINT CHR$(12)
7720     OUTPUT @Pr USING """           DATEN""/"
7730     OUTPUT @Pr;"             ";Farbe$(Pen(1))
7740     FOR I=2 TO 7
7750         OUTPUT @Pr;"             ";Farbe$(Pen(I)),"Level = ";Level(I-1)
7760     NEXT I
7770     PRINT
7780     !
7790     !
7800     VIEWPORT 0,RATIO*327*.25,15,246/3+15
7810     WINDOW -1,325,244,-1
7820     FRAME
```

```
7830      PEN 1
7840      FRAME
7850      !
7860      FOR J=1 TO 4
7870         DISP "FARBE:   ",Farbe$(Pen(J))
7880         PEN ((Pen(J) MOD 5))
7890         FOR I=0 TO 243
7900            FOR K=0 TO 324
7910               MOVE K,I
7920               Sig=Signal(I,K)*.005
7930               IF (Sig<Level(J) AND Sig>=Level(J-1)) THEN IDRAW 0,0
7940            NEXT K
7950         NEXT I
7960         !
7970      NEXT J
7980      DISP "BITTE FARBSTIFTE WECHSELN!"
7990      PEN 0
8000      !
8010      FOR J=1 TO 100
8020         BEEP 1000,.3
8030         BEEP 6000,.2
8040      NEXT J
8050      !
8060      PAUSE
8070      !
8080      FOR J=5 TO 7
8090         DISP "FARBE:   ",Farbe$(Pen(J))
8100         PEN ((Pen(J) MOD 5))
8110         FOR I=0 TO 243
8120            FOR K=0 TO 324
8130               MOVE K,I
8140               Sig=Signal(I,K)*.005
8150               IF (Sig<Level(J) AND Sig>=Level(J-1)) THEN IDRAW 0,0
8160            NEXT K
8170         NEXT I
8180      NEXT J
8190      !
8200      !
8210      PEN 0
8220      BEEP 1200,2
8230      PRINT "VERARBEITUNG ABGESCHLOSSEN!"
8240      RETURN
8250      !
8260      !
8270 Ende: !
8280      SUBEND    !Coulor_7
8290      !
8300      !
8310      !
8320      !
8330      !
8340      !
8350      !
8360   SUB Maxsuch(INTEGER Signal(*),Vsignal(*),Zgrenz,Bgrenz)
8370      !
8380      !
8390      INTEGER I,J,K,L,M,Jm,Km,Sm,A,B,D,E,F,G,P,Q,X,St
8400      !
8410      !
8420      !
8430      FOR J=0 TO Bgrenz        ! ALLE Vsignal WERDEN AUF NEGATIVE WERTE GESE
8440         FOR K=0 TO Zgrenz
8450            Vsignal(J,K)=2200
8460         NEXT K
8470      NEXT J
8480      !
8490      !
8500      !
8510      INPUT "WELCHE METHODE ? (ZEIGER=1,Y-SCAN=2,X-SCAN=3,KOMP=4)",Meth
8520      IF Meth=1 THEN Zeiger
8530      IF Meth=2 THEN Y_scan
8540      IF Meth=3 THEN X_scan
```

```
8550      IF Meth=4 THEN Komp
8560    !
8570    !
8580 Zeiger:  !
8590      INPUT "FELDGROßE ? ((2*X)+1)^2 PUNKTE",X
8600      INPUT "FELDABSTAND ?",Y
8610      INPUT "FELDGROßE IN RÜCKWÄRTSRICHTUNG ?",Z
8620      INPUT "RAUSCHGRENZE ?",Schw
8630      PRINTER IS 701
8640      PRINT "FELDGROßE: ";((2*X)+1);"X";((2*X)+1);"PUNKTE"
8650      PRINT "FELDABSTAND:";Y
8660      PRINT "FELDGROßE IN RÜCKWÄRTSRICHTUNG:";Z
8670      PRINT "RAUSCHGRENZE ";Schw
8680      PRINTER IS 1
8690    !
8700    !
8710    !
8720      BEEP 1000,2
8730      INPUT "MANUELLE EINGABE ?",A$
8740      IF A$<>"J" THEN 8790
8750      INPUT "MANUELLE EINGABE  P , Q !",P,Q
8760      GOTO 9070
8770    !
8780    !
8790      DISP "ABSOLUTES MAXIMUM WIRD BERECHNET..."
8800      FOR J=0 TO Bgrenz            ! SUCHT ABSOLUTES MAXIMUM Sm
8810        FOR K=0 TO Zgrenz
8820          S=Signal(J,K)
8830            IF S>Sm THEN
8840                      Sm=S
8850                      Jm=J
8860                      Km=K
8870                      END IF
8880        NEXT K
8890      NEXT J
8900    !
8910    !
8920      P=Jm
8930      Q=Km
8940    !
8950      PRINT "ABSOLUTES MAXIMUM :",P,Q,Sm
8960      INPUT "IST ABS. MAXIMUM STARTPUNKT ?",D$
8970      IF D$<>"J" THEN INPUT "MANUELLER STARTPUNKT P , Q :",P,Q
8980    !
8990    !
9000      IF P<20 OR Q<20 OR P>223 OR Q>304 THEN
9010                      BEEP 1000,1
9020                      INPUT "MANUELLER STARTPUNKT P , Q :",P,Q
9030      END IF
9040    !
9050    !
9060    !
9070      GINIT
9080      GRAPHICS ON
9090      WINDOW 0,324,0,243
9100      FRAME
9110    !
9120    !
9130 Neu:    !
9140      IF B$="J" THEN
9150              BEEP 1000,1
9160              INPUT "NEUER STARTPUNKT P , Q :",P,Q
9170              DISP "BILD WIRD NEU EINGESPEICHERT..."
9180              ASSIGN @Speicher TO "Image"
9190              ENTER @Speicher;Signal(*)
9200        END IF
9210    !
9220    !
9230 Nächster:   !
9240    !
9250    !
9260      C0=0
9270    !
```

```
9280        !
9290        FOR D=-1 TO 1         ! SUCHT 8 FELDER DER UMGEBUNG AB
9300          FOR E=-1 TO 1
9310            !
9320            !
9330            IF D=0 AND E=0 THEN Weiter
9340            !
9350            C=0
9360            !
9370              FOR A=-X TO X ! FELD MIT 49 PUNKTEN
9380                FOR B=-X TO X
9390                  !
9400                  C=C+Signal(P+A+(Y*D),Q+B+(Y*E))
9410                  !
9420                NEXT B
9430              NEXT A
9440            !
9450            !
9460            IF C>C0 THEN    ! SUCHT ABSOLUTES MAXIMUM
9470                  F=D
9480                  G=E
9490                  C0=C
9500            END IF
9510            !
9520            !
9530 Weiter:           !
9540            !
9550            !
9560          NEXT E
9570        NEXT D
9580        !
9590        !
9600        PRINT P,Q,C0,F,G
9610        !
9620        !
9630        MOVE Q,(243-P)
9640        IDRAW 0,0
9650        Vsignal(P,Q)=2000
9660        !
9670        !
9680        FOR A=-Z TO Z        ! SETZT FELD AUF NULL GEGEN RÜCKWÄRTS GEHEN
9690          FOR B=-Z TO Z
9700            !
9710            Signal(P-(Z*F)+A,Q-(Z*G)+B)=0
9720            !
9730          NEXT B
9740        NEXT A
9750        !
9760        !
9770        P=P+F
9780        Q=Q+G
9790        !
9800        !
9810        IF P<(2*Z)+1 OR Q<(2*Z)+1 OR P>(242-Z-Z) OR Q>(323-Z-Z) THEN Aufhoren
9820        IF P<X+Y+1 OR Q<X+Y+1 OR P>(242-X-Y) OR Q>(323-X-Y) THEN Aufhoren
9830        IF C0<Schw*((2*X)+1)^2 THEN Aufhoren
9840        !
9850        !
9860        GOTO Nächster
9870        !
9880        !
9890 Aufhoren:         !
9900        !
9910        !
9920        BEEP 500,.5
9930        BEEP 1000,.5
9940        BEEP 1500,.5
9950        INPUT "NEUER MANUELLER STARTPUNKT ?",B$
9960        IF B$="J" THEN Neu
9970        !
9980        !
9990        BEEP 2000,1
```

```
10000      INPUT "AUTOMATISCHER RÜCKLAUF ?",C$
10010      IF C$="J" THEN
10020           BEEP 500,2
10030           DISP "BILD WIRD NEU EINGESPEICHERT..."
10040           ASSIGN @Speicher TO "Image"
10050           ENTER @Speicher;Signal(*)
10060           !
10070           !
10080           P=P-F
10090           Q=Q-G
10100           !
10110           !
10120           FOR A=-Z TO Z   ! FELD IN VORWÄRTSRICHTUNG NULL SETZEN
10130             FOR B=-Z TO Z
10140             !
10150             Signal(P+(Z*F)+A,Q+(Z*G)+B)=0
10160             !
10170             NEXT B
10180           NEXT A
10190           !
10200           GOTO Nächster
10210      END IF
10220      !
10230      GOTO Ende
10240      !
10250      !
10260 Y_scan:!
10270      GINIT
10280      GRAPHICS ON
10290      WINDOW 0,324,0,243
10300      FRAME
10310      !
10320      !
10330      INPUT "SIGNALGRENZE",L
10340      PRINTER IS 701
10350      PRINT "MAXIMA IN Y-RICHTUNG","SIGNALGRENZE=";L
10360      PRINTER IS 1
10370      !
10380      FOR J=5 TO 238
10390        FOR K=0 TO 324
10400        S=Signal(J,K)
10410        IF S<L THEN Weiter_y
10420        FOR I=-5 TO 5
10430        IF S<Signal(J+I,K) THEN Weiter_y
10440        NEXT I
10450        MOVE K,(243-J)
10460        IDRAW 0,0
10470        Vsignal(J,K)=2000
10480 Weiter_y:  !
10490        NEXT K
10500      NEXT J
10510      !
10520      !
10530      BEEP 500,.5
10540      BEEP 1000,.5
10550      BEEP 1500,.5
10560      !
10570      GOTO Ende
10580      !
10590      !
10600 X_scan:       !
10610      !
10620      GINIT
10630      GRAPHICS ON
10640      WINDOW 0,324,0,243
10650      FRAME
10660      !
10670      !
10680      INPUT "SIGNALGRENZE",L
10690      PRINTER IS 701
10700      PRINT "MAXIMA IN X-RICHTUNG","SIGNALGRENZE=";L
10710      PRINTER IS 1
```

```
10720          !
10730          !
10740          FOR J=0 TO 243
10750            FOR K=5 TO 319
10760            S=Signal(J,K)
10770            IF S<L THEN Weiter_x
10780            FOR I=-5 TO 5
10790            IF S<Signal(J,K+I) THEN Weiter_x
10800            NEXT I
10810            MOVE K,(243-J)
10820            IDRAW 0,0
10830            Vsignal(J,K)=2000
10840 Weiter_x:       !
10850            NEXT K
10860          NEXT J
10870          !
10880          !
10890          BEEP 500,.5
10900          BEEP 1000,.5
10910          BEEP 1500,.5
10920          !
10930          !
10940          GOTO Ende
10950          !
10960          !
10970          !
10980          !
10990          !
11000 Komp:          !
11010          !
11020          !
11030          !
11040          GINIT
11050          GRAPHICS ON
11060          WINDOW 0,324,0,243
11070          FRAME
11080          !
11090          !
11100          INPUT "SIGNALGRENZE",L
11110          INPUT "X-MAXIMUM VON ZEILE... BIS...",Xmin,Xmax
11120          INPUT "Y-MAXIMUM VON SPALTE...BIS...",Ymin,Ymax
11130          INPUT "DIAGONAL-MAXIMUM VON K0...BIS   ",K0min,K0max
11140          INPUT "RADIAL-MAXIMUM, MITTELPUNKT ?",Jm,Km
11150          INPUT "RADIUS VON...BIS...",Rmin,Rmax
11160          INPUT "WINKEL VON...BIS...",Amin,Amax
11170          INPUT "SCHRITTWEITE...",Da
11180          INPUT "DÄMPFUNGSBREITE",X
11190          PRINTER IS 701
11200          PRINT "MAXIMUM IN X-RICHTUNG VON ZEILE";Xmin;"BIS";Xmax
11210          PRINT "MAXIMUM IN Y-RICHTUNG VON SPALTE";Ymin;"BIS";Ymax
11220          PRINT "MAXIMUM IN DIAGONALE VON FUßPUNKT";K0min;"BIS";K0max
11230          PRINT "RADIALMAXIMUM: MITTE:";Jm;Km;"Rmin";Rmin;"Rmax";Rmax;"WINKEL
";Amin;"-";Amax
11240          PRINT "SIGNALGRENZE:";L,"DÄMPFUNGSBREITE:";X
11250          PRINTER IS 1
11260          !
11270          !
11280          FOR J=Xmin TO Xmax
11290            S0=-20000
11300            A=0
11310            B=0
11320            FOR K=X TO (324-X)
11330            S1=-200
11340            IF Signal(J,K)<L THEN Weiter1
11350            !
11360            !
11370              FOR I=-X TO X
11380              S1=S1+Signal(J,K+I)
11390              NEXT I
11400            !
11410            !
11420            IF S1>S0 THEN
```

```
11430                    S0=S1
11440                    A=J
11450                    B=K
11460                    GOTO Weiter1
11470        END IF
11480     !
11490     !
11500        MOVE B,(243-A)
11510        IDRAW 0,0
11520        Vsignal(A,B)=2000
11530        K=324-X
11540     !
11550     !
11560 Weiter1:     !
11570        NEXT K
11580     NEXT J
11590  !
11600     BEEP 1000,1
11610  !
11620     FOR K=Ymin TO Ymax
11630     !
11640     !
11650        S0=-20000
11660        A=0
11670        B=0
11680     !
11690        FOR J=(243-X) TO X STEP -1
11700        S1=0
11710     !
11720        IF Signal(J,K)<L THEN Weiter2
11730     !
11740        FOR I=-X TO X
11750          S1=S1+Signal(J+I,K)
11760        NEXT I
11770     !
11780     !
11790        IF S1>S0 THEN
11800                    S0=S1
11810                    A=J
11820                    B=K
11830                    GOTO Weiter2
11840        END IF
11850     !
11860        MOVE B,(243-A)
11870        IDRAW 0,0
11880        Vsignal(A,B)=2000
11890        J=X
11900     !
11910     !
11920 Weiter2:     !
11930        NEXT J
11940     NEXT K
11950  !
11960     BEEP 1000,1
11970  !
11980     FOR K0=K0min TO K0max
11990  !
12000  !
12010     S0=-20000
12020     A=0
12030     B=0
12040  !
12050  !
12060     FOR J=(243-X) TO X STEP -1
12070     !
12080       K=K0+243-J
12090       IF K<X OR K>(324-X) THEN Weiter3
12100       S1=0
12110     !
12120       IF Signal(J,K)<L THEN Weiter3
12130     !
12140     !
12150       FOR I=-X TO X
```

```
12160              S1=S1+Signal(J-I,K+I)
12170         NEXT I
12180         !
12190         !
12200         IF S1>S0 THEN
12210                     S0=S1
12220                     A=J
12230                     B=K
12240                     GOTO Weiter3
12250         END IF
12260         !
12270         !
12280         MOVE B,(243-A)
12290         IDRAW 0,0
12300         Vsignal(A,B)=2000
12310         J=X
12320         !
12330         !
12340 Weiter3:         !
12350         !
12360         !
12370         NEXT J
12380     NEXT K0
12390     !
12400     BEEP 1000,2
12410     !
12420     !
12430     MOVE Km,(243-Jm)
12440     IDRAW 0,0
12450     DEG
12460     !
12470     FOR Al=Amin TO Amax STEP Da
12480     S0=-20000
12490     A=0
12500     B=0
12510     !
12520     !
12530     FOR R=Rmax TO Rmin STEP -1
12540       !
12550       S1=0
12560       IF Signal((Jm+INT(R*COS(Al))),(Km-INT(R*SIN(Al))))<L THEN Weiter4
12570       Jr=Jm+INT((R+X)*COS(Al))
12580       Kr=Km-INT((R+X)*SIN(Al))
12590       IF Jr<0 OR Jr>243 OR Kr<0 OR Kr>324 THEN Weiter4
12600       !
12610       FOR I=-X TO X
12620         !
12630         J=Jm+INT((R+I)*COS(Al))
12640         K=Km-INT((R+I)*SIN(Al))
12650         S1=S1+Signal(J,K)
12660         !
12670       NEXT I
12680       !
12690       !
12700       IF S1>S0 THEN
12710                     S0=S1
12720                     A=Jm+INT(R*COS(Al))
12730                     B=Km-INT(R*SIN(Al))
12740                     GOTO Weiter4
12750       END IF
12760       !
12770       !
12780       MOVE B,(243-A)
12790       IDRAW 0,0
12800       Vsignal(A,B)=2000
12810       R=Rmin
12820       !
12830       !
12840 Weiter4:        !
12850       !
12860       !
12870       NEXT R
12880     NEXT Al
```

```
12890        !
12900        !
12910        FOR N=1 TO 50
12920        BEEP RND*2000,RND/10
12930        NEXT N
12940        !
12950 Ende:  !
12960        !
12970        SUBEND
```

We claim as our invention:

1. In a method for imaging electrical barrier regions including pn-junctions in semiconductors by means of processing particle beam induced signals in a scanning corpuscular microscope, the improvement comprising the steps of:
   determining a point P(x,y) estimated to be a center of curvature of a first portion of a profile of the barrier region and then scanning along a first line between said point P(x,y) and a shortest path from said point P(x,y) and a point H lying on the electrical barrier region profile to be located so that particle beam induced signals are generated along this line scan;
   selecting a second point P(x+Δx, y+Δy) in close proximity to the point P(x,y) and scanning along a second line containing said second point and a shortest path from said second point to a point on the barrier region profile at least in a vicinity of point H;
   comparing the particle beam induced signals resulting along the second line to the particle beam induced signals generated along the first scanning line to determine whether the selected point P(x,y) is substantially a center of curvature for the portion of the barrier region being determined; and
   analyzing other portions of the barrier region by repeating the foregoing steps.

2. A method according to claim 1 including the step of eliminating effects caused by statistical phenomena by averagings taken over a number of neighboring scanning points when determining the shortest paths.

3. A method according to claim 2 including the step of selecting the number of scanning points over which averaging is carried out such that an addition or omission of one scanning point does not substantially change a result with respect to this plurality of scanning points.

4. In a method for imaging electrical barrier regions including pn-junctions in semiconductors by means of processing particle beam induced signals in a scanning corpuscular microscope, the improvement comprising the steps of:
   selecting a scanning point M(x,y) in a scanning field such that a particle beam induced signal at said scanning point M(x,y) exhibits a highest value with reference to all possible particle beam induced signals at remaining scanning points of the field;
   selecting a further scanning point N(x,y) near said scanning point M(x,y) such that a particle beam induced signal at said further scanning point N(x,y) exhibits a highest value among all possible particle beam induced signals in an immediate environment of said scanning point M(x,y) without considering the particle beam induced signal at said scanning point M(x,y);
   selecting another scanning point near said further scanning point N(x,y) such that a particle beam induced signal exhibits a highest value without considering the values of the particle beam induced signals at said scanning points M(x,y) and N(x,y); and
   continuing the foregoing steps for a succession of scanning points M(x,y), N(x,y), . . . so as to define a line of the electric barrier region.

5. A method according to claim 4 including the step of eliminating effects caused by statistical phenomena by averagings taken over a number of neighboring scanning points in determining a size of the scanning fields.

6. A method according to claim 5 including the step of selecting the number of scanning points over which averaging is carried out such that an addition or omission of one scanning point does not substantially change a result with respect to this plurality of scanning points.

7. In a method for imaging electrical barrier regions including pn-junctions in semiconductors by means of processing particle beam induced signals in a scanning corpuscular microscope, and wherein a width b of an electrical barrier region is measured, the improvement comprising the steps of:
   scanning across the barrier;
   logarithmizing signals which are particle beam induced;
   selecting points F(x,y) on a rising edge and on a falling edge of the logarithmized, particle beam induced signal along the line scan such that edges of this logarithmized, particle beam induced signal along the scan line are as linear as possible;
   identifying slopes of this logarithmized particle beam induced overall signal along the line scan with the points F(x,y);
   placing straight lines having the slopes thus identified through points F corresponding to the scanning points F(x,y) on the logarithmized, particle beam induced signal;
   defining intersections T of said straight lines thus defined with a horizontally proceeding straight line placed through a maximum of the logarithmized, particle beam induced signal; and
   defining said width b of the electrical barrier layer as a distance between the intersections T.

* * * * *